(12) United States Patent  
Krishnan et al.

(10) Patent No.: US 9,960,233 B2  
(45) Date of Patent: May 1, 2018

(54) EXPITAXIALLY REGROWN HETEROSTRUCTURE NANOWIRE LATERAL TUNNEL FIELD EFFECT TRANSISTOR

(71) Applicant: GLOBALFOUNDRIES INC., Grand Cayman (KY)

(72) Inventors: Siddarth A. Krishnan, Peekskill, NY (US); Unoh Kwon, Fishkill, NY (US); Vijay Narayanan, New York, NY (US); Jeffrey W. Sleight, Ridgefield, CT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days. days.

(21) Appl. No.: 15/600,837

(22) Filed: May 22, 2017

(65) Prior Publication Data

US 2017/0263707 A1 Sep. 14, 2017

Related U.S. Application Data

(62) Division of application No. 14/887,572, filed on Oct. 20, 2015, now Pat. No. 9,660,027.

(51) Int. Cl.
*H01L 29/06* (2006.01)
*H01L 29/66* (2006.01)
(Continued)

(52) U.S. Cl.
CPC .... *H01L 29/0673* (2013.01); *H01L 29/41758* (2013.01); *H01L 29/42356* (2013.01);
(Continued)

(58) Field of Classification Search
CPC ............... H01L 29/165; H01L 29/205; H01L 29/41758; H01L 29/42356; H01L 29/458;
(Continued)

(56) References Cited

U.S. PATENT DOCUMENTS 7,465,634 B2 12/2008 Lim et al.
8,008,146 B2 8/2011 Bangsaruntip et al.
(Continued)

FOREIGN PATENT DOCUMENTS

CN 104241378 A 12/2014

OTHER PUBLICATIONS

Bangsaruntip, S. et al., "Density scaling with gate-all-around silicon nanowire MOSFETs for the 10 nm node and beyond", Electron Devices Meeting (IEDM), 2013 IEEE International, pp. 20.2.1-20.2.4.

*Primary Examiner* — Bac Au
(74) *Attorney, Agent, or Firm* — Scully Scott Murphy and Presser (57) ABSTRACT

After forming a buried nanowire segment surrounded by a gate structure located on a substrate, an epitaxial source region is grown on a first end of the buried nanowire segment while covering a second end of the buried nanowire segment and the gate structure followed by growing an epitaxial drain region on the second end of the buried nanowire segment while covering the epitaxial source region and the gate structure. The epitaxial source region includes a first semiconductor material and dopants of a first conductivity type, while the epitaxial drain region includes a first semiconductor material different from the first semiconductor material and dopants of a second conductivity type opposite the first conductivity type.

20 Claims, 5 Drawing Sheets

(51) Int. Cl.
*H01L 29/739* (2006.01)
*H01L 29/417* (2006.01)
*H01L 29/423* (2006.01)
*H01L 29/775* (2006.01)
*H01L 29/45* (2006.01)
*H01L 29/165* (2006.01)
*H01L 29/205* (2006.01)

(52) U.S. Cl.
CPC .. *H01L 29/66356* (2013.01); *H01L 29/66469* (2013.01); *H01L 29/66553* (2013.01); *H01L 29/7391* (2013.01); *H01L 29/775* (2013.01); *H01L 29/165* (2013.01); *H01L 29/205* (2013.01); *H01L 29/45* (2013.01); *H01L 29/458* (2013.01)

(58) Field of Classification Search
CPC ............. H01L 29/66469; H01L 29/775; H01L 29/42392; H01L 29/78696; H01L 29/66439; H01L 29/0665; H01L 29/66795; H01L 21/84; H01L 27/1203; H01L 29/0669; H01L 29/7848; H01L 21/02532; H01L 21/823814; H01L 21/823821; H01L 29/0653; H01L 29/1054; H01L 29/401; H01L 29/41725; H01L 29/41791; H01L 29/66636; H01L 29/78618; H01L 29/78684; B82Y 10/00; B82Y 40/00; Y10S 977/762; Y10S 977/938
See application file for complete search history.

(56) References Cited

U.S. PATENT DOCUMENTS

| | | |
|---|---|---|
| 8,022,439 B2 * | 9/2011 | Kajiyama ............... B82Y 10/00 257/192 |
| 8,124,961 B2 | 2/2012 | Suk et al. |
| 8,173,993 B2 | 5/2012 | Bangsaruntip et al. |
| 8,324,030 B2 | 12/2012 | Bangsaruntip et al. |
| 8,648,330 B2 | 2/2014 | Bangsaruntip et al. |
| 8,723,162 B2 | 5/2014 | Bangsaruntip et al. |
| 8,815,683 B2 | 8/2014 | Kim et al. |
| 9,257,527 B2 | 2/2016 | Hashemi et al. |
| 9,502,518 B2 * | 11/2016 | Liu ................... H01L 29/42364 |
| 9,548,381 B1 * | 1/2017 | Krishnan .......... H01L 29/66977 |
| 2008/0128760 A1 | 6/2008 | Jun et al. |
| 2012/0305886 A1 | 12/2012 | Sleight et al. |
| 2012/0326125 A1 | 12/2012 | Guo et al. |
| 2013/0221328 A1 | 8/2013 | Sleight et al. |
| 2014/0151639 A1 | 6/2014 | Chang et al. |
| 2014/0264280 A1 | 9/2014 | Kim et al. |
| 2015/0069328 A1 | 3/2015 | Leobandung |
| 2015/0144880 A1 | 5/2015 | Rachmady et al. |
| 2015/0303197 A1 | 10/2015 | Ching et al. |
| 2015/0333162 A1 | 11/2015 | Bouche et al. |
| 2015/0372115 A1 | 12/2015 | Koh et al. |
| 2015/0380557 A1 | 12/2015 | Le et al. |
| 2016/0027929 A1 | 1/2016 | Cheng et al. |
| 2016/0043207 A1 | 2/2016 | Kim et al. |
| 2017/0133279 A1 * | 5/2017 | Peng ............... H01L 21/823821 |

* cited by examiner

EXPITAXIALLY REGROWN HETEROSTRUCTURE NANOWIRE LATERAL TUNNEL FIELD EFFECT TRANSISTOR

RELATED APPLICATION

This application is a divisional of U.S. Ser. No. 14/887,572, filed Oct. 20, 2015, the entire contents of which are incorporated herein by reference.

BACKGROUND

The present disclosure relates to semiconductor structures, and particularly to nanowire tunnel field effect transistors.

Tunnel field effect transistors (TFETs) have emerged as an alternative for conventional complementary metal oxide semiconductor (CMOS) devices by enabling the supply voltage scaling in ultra-low power, energy efficient computing, due to their sub-60 mV/decade sub-threshold slope. TFETs possess unique device characteristics such as an asymmetrical source/drain design that induces uni-directional conduction and enhances the on-state Miller capacitance effect, thus enabling steep switching at low voltages. TFETs require low bandgap materials, steep tunneling junctions and improved electrostatics. Nanowire TFETs are attractive for low power, high density applications since nanometer scaled wires inherently provide excellent electrostatic control of the device. Therefore, methods for fabrication lateral heterostructure nanowire TFETs are needed.

BRIEF SUMMARY

The present application provides a nanowire integration scheme that enables lateral heterostructure nanowire TFETs. After forming a buried nanowire segment surrounded by a gate structure located on a substrate, an epitaxial source region is grown on a first end of the buried nanowire segment while covering a second end of the buried nanowire segment and the gate structure followed by growing an epitaxial drain region on the second end of the buried nanowire segment while covering the epitaxial source region and the gate structure. The epitaxial source region comprises a first semiconductor material and dopants of a first conductivity type, while the epitaxial drain region comprises a first semiconductor material different from the first semiconductor material and dopants of a second conductivity type opposite the first conductivity type.

According to an aspect of the present application, a semiconductor structure is provided. The semiconductor structure includes a gate structure located on a substrate and surrounding at least one buried nanowire segment. The at least one buried nanowire segment has a first end and a second end opposite the first end. An epitaxial source region extends from the first end of the at least one buried nanowire segment. The epitaxial source region includes a first semiconductor material and dopants of a first conductivity type. An epitaxial drain region extends from the second end of the at least one buried nanowire segment. The epitaxial drain region comprising a second semiconductor material different from the first semiconductor material and dopants of a second conductivity type opposite the first conductivity type.

According to another aspect of the present application, a method of forming a semiconductor structure is provided. The method includes forming at least one buried nanowire segment surrounded by a gate structure located on a substrate. The at least one buried nanowire segment has a first end and a second end opposite the first end. An epitaxial source region is then formed extending from the first end of the at least one buried nanowire segment. The epitaxial source region includes a first semiconductor material and dopants of a first conductivity type. Next, an epitaxial drain region is formed extending from the second end of the at least one buried nanowire segment. The epitaxial drain region includes a second semiconductor material different from the first semiconductor material and dopants of a second conductivity type opposite the first conductivity type.

DETAILED DESCRIPTION

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

Figure 1:
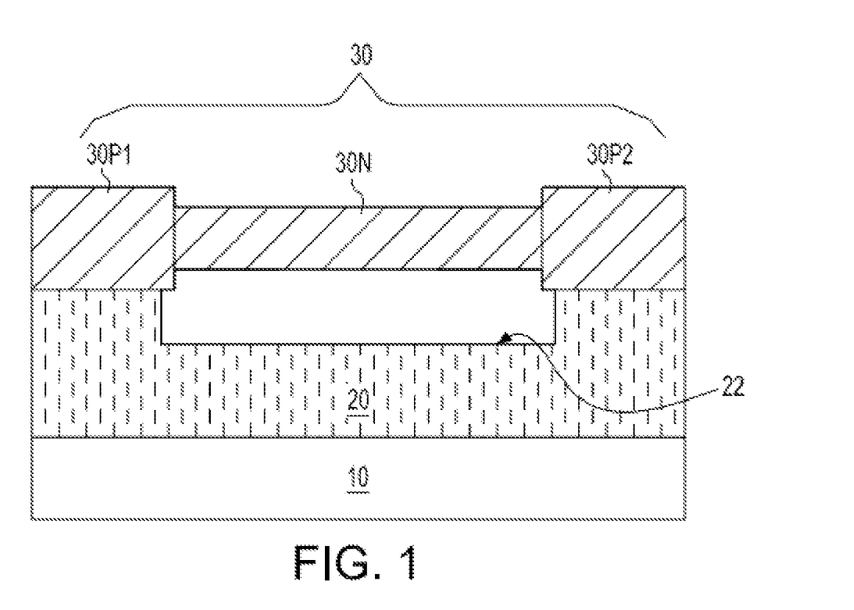
FIG. 1 is a cross-sectional view of an exemplary semiconductor structure after forming a top semiconductor portion including nanowires suspended over a structure by a first pad portion over and a second pad portion according to an embodiment of the present application.

Referring to FIG. 1, an exemplary semiconductor structure according to an embodiment of the present application includes a top semiconductor portion 30 formed over a substrate. The top semiconductor portion 30 includes a first pad portion 30P1 located at one end, a second pad portion 30P2 located at an opposite end, and one or more nanowires 30N connecting the first pad portion 30P1 and the second pad portion 30P2.

The top semiconductor portion 30 can be formed by patterning a top semiconductor layer of a semiconductor-on-insulator (SOI) substrate. The SOI substrate includes, from bottom to top, a handle substrate 10, a buried insulator layer 20 and a top semiconductor layer (not shown) from which the top semiconductor portion 30 is derived.

The handle substrate 10 may include a semiconductor material, such as, for example, silicon (Si), silicon germanium (SiGe), silicon germanium carbide (SiGeC), silicon carbide (SiC), an III-V compound semiconductor, an II-VI compound semiconductor or any combinations thereof. Multilayers of semiconductor materials can also be used as the semiconductor material of the handle substrate 10. In one embodiment, the handle substrate 10 is composed of single crystalline silicon. The thickness of the handle substrate 10 can be from 50 µm to 2 mm, although lesser and greater thicknesses can also be employed.

The buried insulator layer 20 may include a dielectric material such as silicon oxide, silicon nitride, silicon oxynitride, boron nitride or a combination thereof. In one embodiment, the buried insulator layer 20 may be formed by a conventional deposition process such as, for example chemical vapor deposition (CVD) or physically vapor deposition (PVD). In another embodiment, the buried insulator layer 20 may be formed using a thermal growth process, such as thermal oxidation, to convert a surface portion of the handle substrate 10. The thickness of the buried insulator layer 20 that is formed can be from 50 nm to 200 nm, although lesser or greater thicknesses can also be employed.

The top semiconductor layer may include any semiconductor material as mentioned above for the handle substrate 10. Exemplary semiconductor materials that can be employed as the top semiconductor layer include, but are not limited to, Si, Ge, SiGe, SiC and SiGeC and III/V compound semiconductors such as, for example, InAs, GaAs, GaAsSb and InP. The semiconductor materials of the top semiconductor layer and the handle substrate 10 may be the same or different. In one embodiment, the top semiconductor layer includes a single crystalline semiconductor material such as, for example, single crystalline silicon.

The top semiconductor layer is typically provided as an intrinsic single crystalline semiconductor layer and is formed by a conventional deposition process, such as CVD or plasma enhanced chemical vapor deposition (PECVD). The top semiconductor layer that is formed may have a thickness from 20 nm to 600 nm, although lesser or greater thicknesses can also be employed. Alternatively, the top semiconductor layer may be formed using a smart cut process where two semiconductor wafers are bonded together with an insulator in between.

The top semiconductor layer may be patterned by lithography patterning and etching. For example, a photoresist layer (not shown) can be applied over the top semiconductor layer and lithographically exposed to form a pattern of fins and landing pads over the top semiconductor layer. The pattern in the photoresist layer is transferred in to the top semiconductor layer by an anisotropic etch to provide a nanowire portion-containing structure (not shown). The anisotropic etch can be a dry etch such as, for example, reactive ion etch (RIE) or a wet etch. The nanowire portion-containing structure includes the first pad portion 30P1, the second pad portion 30P2, and one or more nanowire portions (not shown) connecting the first pad portion 30P1 and the second pad portion 30P2. The nanowires 30N are later formed for the nanowire portions.

The buried insulator layer 20 is recessed in regions not covered by the top semiconductor portion 30 by an isotropic etch. The first and second pad portions (30P1, 30P2) can be employed as an etch mask during the recessing of the physically exposed portions of the buried insulator layer 20. The isotropic etch can be a wet etch or a dry etch that removes the dielectric material of the buried insulator layer 20 selective to the semiconductor material of the top semiconductor portion 30. Portions of the buried insulator layer 20 are thus removed from underneath the nanowire portions and from underneath peripheral portions of the first and second pad portions 30P1, 30P2. The nanowire portions become suspended above the recessed surface 22 of buried insulator layer 20 by the first and second pad portions 30P1, 30P2.

Following the isotropic etch, the nanowire portions may be smoothed to form the nanowires 30N suspended above the buried insulator layer 20 by the first pad portion 30P1 and the second pad portion 30P2. The smoothing of the nanowire portions may be performed by, for example, annealing of the nanowire portions in hydrogen. Each of the nanowires 30N thus formed can have a non-rectangular vertical cross-sectional shape along planes perpendicular to a direction from the first pad portion 30P1 towards the second pad portion 30P2. For example, the nanowires 30N can have a circular or elliptical vertical cross-sectional shape. An oxidation process may be performed to reduce the diameter of the nanowires 30N to desired dimensions.

Figure 2:
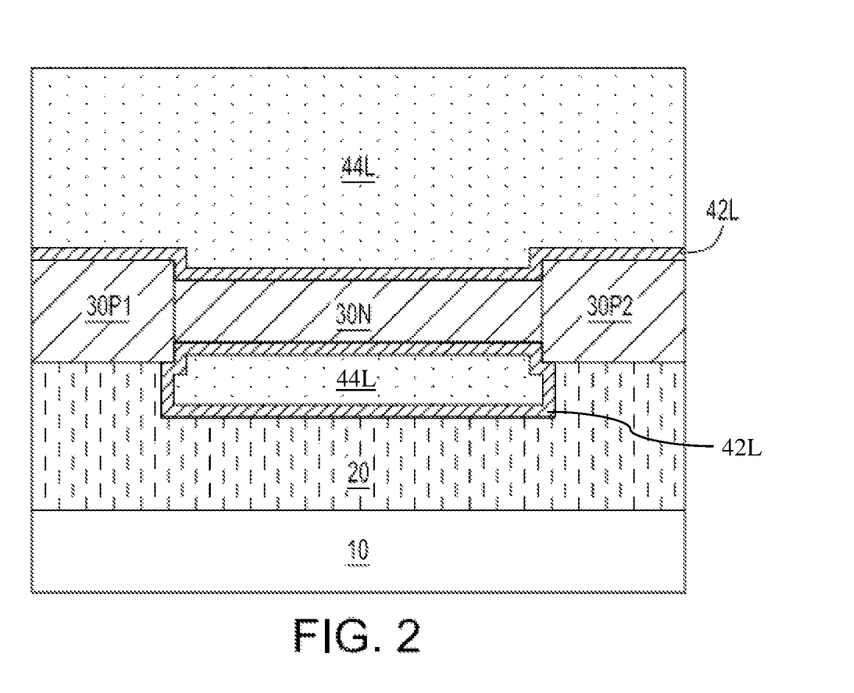
FIG. 2 is a cross-sectional view of the exemplary semiconductor structure of FIG. 1 after forming a gate material stack including, from bottom to top, a gate dielectric layer and a gate electrode layer over the top semiconductor portion and the substrate.

Referring to FIG. 2, a gate material stack including, from bottom to top, a gate dielectric layer 42L and a gate electrode layer 44L is formed. The gate dielectric layer 42L is conformally deposited on physically exposed surfaces of the top semiconductor portion 30. The gate dielectric layer 42L can include a high dielectric constant (high-k) dielectric material having a dielectric constant greater than 7.9 and/or a conventional gate dielectric material such as silicon oxide, silicon nitride, and/or silicon oxynitride. Examples of high-k dielectric material include, but are not limited to, $HfO_2$, $ZrO_2$, $La2O_3$, $Al_2O_3$, $TiO_2$, $SrTiO_3$, $LaAlO_3$, $Y2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof. Each value of x is independently from 0.5 to 3 and each value of y is independently from 0 to 2.

The gate dielectric layer 42L can be formed by conversion of surface portions of the semiconductor material in the top semiconductor portion 30 into a dielectric material such as a dielectric oxide, a dielectric nitride, and/or a dielectric oxynitride. Alternately or additionally, the gate dielectric layer 42L can be formed by conformal deposition of a dielectric material such as a metallic oxide, a metallic nitride, and/or a metallic oxynitride. The conversion of surface portions of the semiconductor material into a dielectric material can be performed, for example, by thermal oxidation, thermal nitridation, plasma oxidation, and/or plasma nitridation. The deposition of a dielectric material can be performed, for example, by atomic layer deposition (ALD) or CVD. The gate dielectric layer 42L that is formed can have a thickness from 0.9 nm to 6 nm, although lesser and greater thicknesses can also be employed.

The gate electrode layer 44L is deposited over the gate dielectric layer 42L. The gate electrode layer 44L fills the spaces between the nanowires 30N and the buried insulator layer 20. The gate electrode layer 44L may include a conductive material, which can be a doped semiconductor material, a metallic material, or a combination thereof. The doped semiconductor material, if present, can be doped polysilicon, doped polycrystalline germanium, a doped silicon-germanium alloy, any other doped elemental or compound semiconductor material, or a combination thereof. The metallic material, if present, can be any metallic material that can be deposited by CVD, PVD, or a combination thereof. For example, the metallic material can include aluminum and/or tungsten. The thickness of the gate electrode layer 44L can be from 100 nm to 500 nm, although lesser and greater thicknesses can also be employed.

Figure 3:
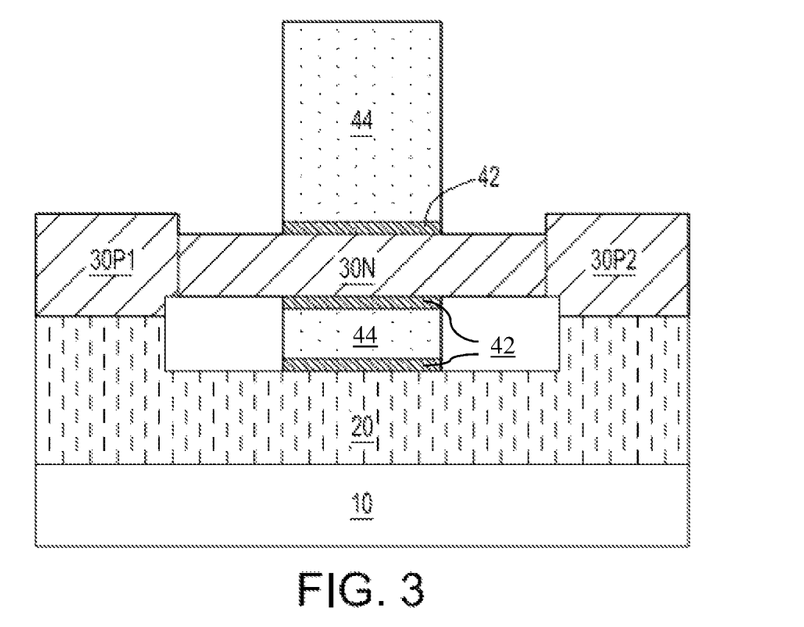
FIG. 3 is a cross-sectional view of the exemplary semiconductor structure of FIG. 2 after forming a gate stack over a portion of each of the nanowires by patterning the gate material stack.

Referring to FIG. 3, a gate stack is formed by patterning the gate material stack (42L, 44L). Specifically, a hardmask layer can be applied over the gate electrode layer 44L and lithographically patterned to form a patterned hardmask layer (not shown) that defines a position, size and shape of the gate stack. The hardmask layer may be formed from, for example, a dielectric nitride such as, for example, silicon nitride. Portions of the gate dielectric layer 42L and the gate electrode layer 44L that are not covered by the patterned hard mask layer are removed by an anisotropic etch. Following the anisotropic etch, an isotropic etch is performed to remove portions of the gate dielectric layer 42L and the gate electrode layer 44L that remain underneath the nanowires 30N and in regions not masked by the patterned hardmask layer. The isotropic etch may be performed, for example, using a diluted hydrofluoric acid (DHF). Any remaining patterned hardmask layer can be removed by oxygen-based plasma etching.

The gate stack thus formed includes a gate dielectric 42 which is a remaining portion of the gate dielectric layer 42L and a gate electrode 44 which is a remaining portion of the gate electrode layer 44L. As shown in FIG. 2, since the nanowires 30 have been suspended over the buried insulator layer 20, the gate stack (42, 44) completely surrounds a portion of each of the nanowires 30N. This is referred to as a gate-all-around (GAA) configuration.

Figure 4:
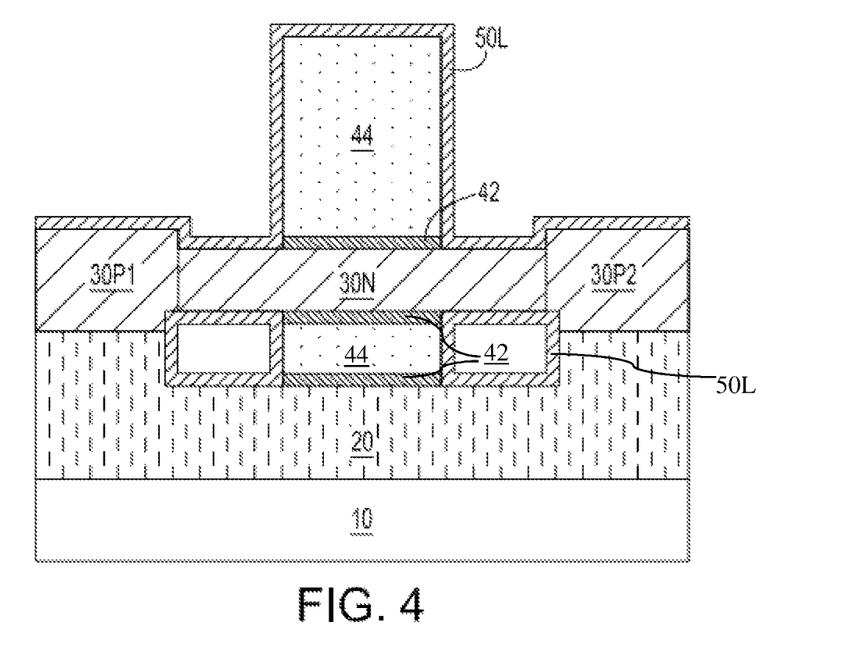
FIG. 4 is a cross-sectional view of the exemplary semiconductor structure of FIG. 3 after forming a gate spacer layer on exposed surfaces of the top semiconductor portion, the substrate and the gate stack.

Referring to FIG. 4, a gate spacer layer 50L is formed on exposed surfaces of the top semiconductor portion 30, the buried insulator layer 20 and the gate stack (42, 44) by conformally depositing a dielectric spacer material utilizing CVD or ALD. Exemplary dielectric spacer materials may include, but are not limited to, a dielectric nitride and a dielectric oxide. In one embodiment, the gate spacer layer 50L is composed of silicon nitride. The thickness of the gate spacer layer 50L can be from 3 nm to 100 nm, although lesser and greater thicknesses can also be employed.

Figure 5:
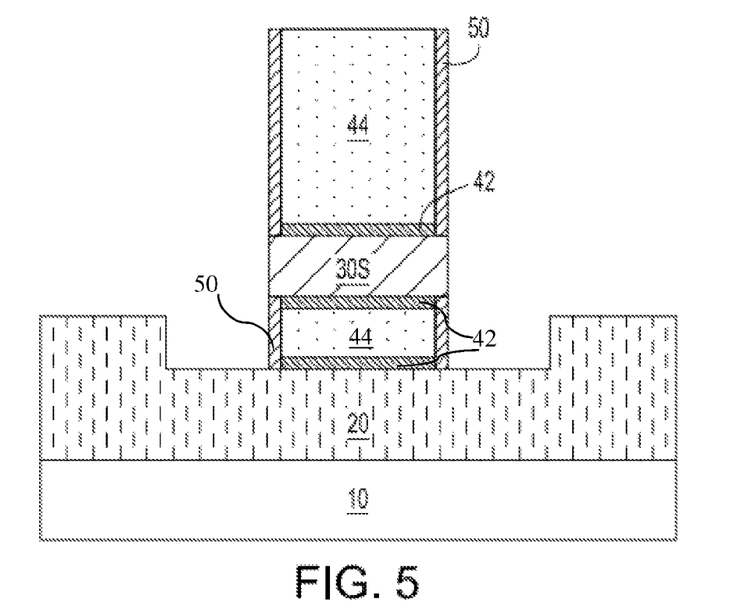
FIG. 5 is a cross-sectional view of the exemplary semiconductor structure of FIG. 4 after forming a gate spacer on sidewalls of the gate stack and removing portions of the top semiconductor portion that are not covered by the gate stack or the gate spacer to provide buried nanowire segments.

Referring FIG. 5, an anisotropic etch is performed to removes horizontal portions of the gate spacer layer 50L. The anisotropic etch can be, for example, RIE. Remaining vertical portions of the gate spacer 50L constitute a gate spacer 50 present on sidewalls of the gate stack (42, 44). The gate stack (42, 44) and the gate spacer 50 together define a gate structure (42, 44, 50).

Subsequently, an selective etch may be performed to remove the first and the second pad regions 30P1, 30P2 and portions of the nanowires 30N that are not covered by the gate structure (42, 44, 50), leaving buried nanowire segment 30S. The buried nanowire segments 30S are remaining portions of the nanowire 30N that are surrounded by the gate structure (42, 44, 50). In one embodiment and as shown in FIG. 5, end surfaces of the buried segments 30S are vertically coincident with outer sidewalls of the gate spacer 50. The selective etch may, for example, be an RIE based on HBr chemistry that removes the semiconductor material while reducing the etching of dielectric material such as silicon oxide and silicon nitride.

Figure 6:
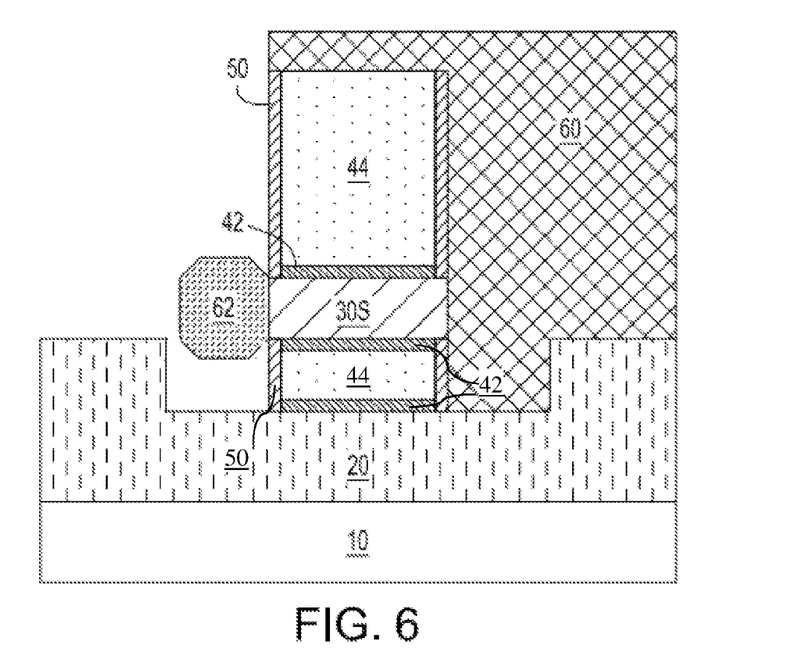
FIG. 6 is a cross-sectional view of the exemplary semiconductor structure of FIG. 5 after forming a first epitaxial semiconductor region extending from first ends of the buried nanowire segments while covering the second ends of the buried nanowire segments.

Referring to FIG. 6, a first epitaxial semiconductor region 62 is formed adjoined to a first side of the gate structure (42, 44, 50) by a first selective epitaxial growth process. The first epitaxial semiconductor region 62 merges adjacent buried segments 30S on the first ends. The term "epitaxial growth and/or deposition" means the growth of a semiconductor material on a deposition surface of a semiconductor material, in which the semiconductor material being grown has the same (or nearly the same) crystalline characteristics as the semiconductor material of the deposition surface. The first epitaxial semiconductor region 62 may have faceted surfaces.

The first epitaxial semiconductor region 62 can be formed utilizing block mask technology. A first mask layer (not shown) is applied over the buried insulator layer 20, the buried nanowire segments 30S and the gate structure (42, 44, 50) and then lithographically patterned so that the patterned first mask layer 60 covers the second ends of the buried nanowire segments 30S while exposing the first end surfaces of the buried nanowire segment 30S that would be subjected to the epitaxial deposition. The first mask layer can be a photoresist layer or a photoresist layer in conjunction with hardmask layer(s). The first epitaxial semiconductor region 62 is then formed by epitaxially depositing a semiconductor material over the first end surfaces of buried nanowire segments 30S, but not on dielectric surfaces of the buried insulator layer 20 and the gate spacer 50. The first epitaxial semiconductor region 62 may be n-type or p-type doped. Exemplary p-type dopants include, but are not limited to, boron (B), aluminum (Al), gallium (Ga) and indium (In). Exemplary n-type dopants include, but are not limited to, antimony (Sb), arsenic (As) and phosphorous (P). Dopants may be introduced into the first epitaxial semiconductor region 62 by in-situ doping during the epitaxial growth of the first semiconductor material. In one embodiment of the present application, the first epitaxial semiconductor region 26 has a p-type conductivity The semiconductor materials providing the first epitaxial semiconductor region 62 can be selected from, but are not limited to, silicon, germanium silicon germanium, silicon carbon, silicon germanium carbon, a compound semiconductor material, or an alloy thereof. In instances when the buried nanowire segments 30S are composed of intrinsic silicon, the first epitaxial semiconductor region 62 can include p-doped germanium. A heterojunction thus is present at the interface between each of the buried nanowire segments 30S and the first epitaxial semiconductor region 62. In instances when the first epitaxial semiconductor region 62 is composed an III-V compound semiconductor material, the buried nanowire segments 30S can include a semiconductor material that is lattice matched and exhibits a broken-gap energy band alignment with the III-V compound semiconductor material providing the first epitaxial semiconductor region 62. For example, when the buried nanowire segments 30S include InGaAs, the first epitaxial semiconductor region 62 can include GaAsSb. In another example, when the buried nanowire segments 30S include InAs, the first epitaxial semiconductor region 62 can include GaSb.

After formation of the first epitaxial semiconductor region 62, the patterned first mask layer 60 can be removed, for example, by oxygen-based plasma etching.

Figure 7:
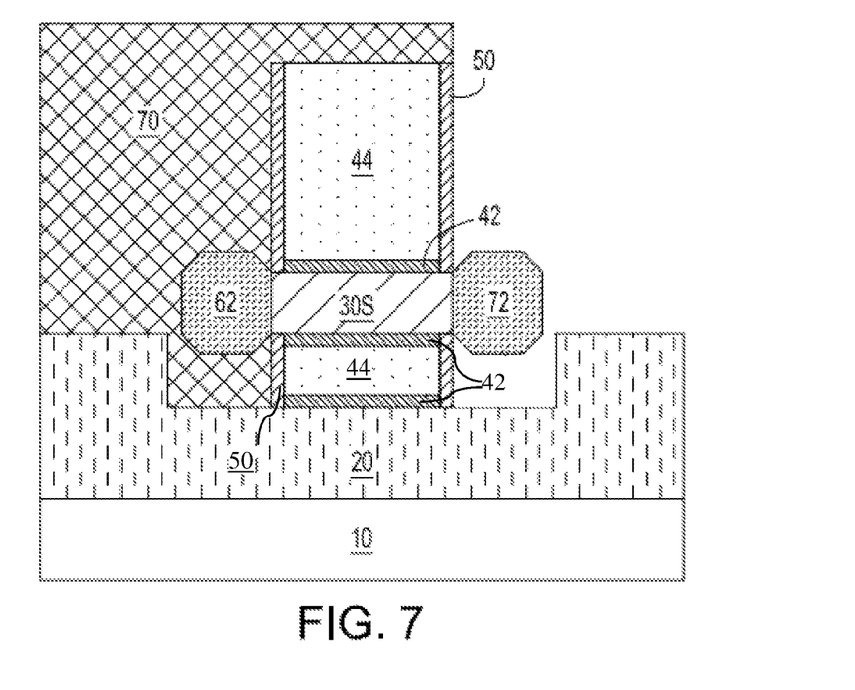
FIG. 7 is a cross-sectional view of the exemplary semiconductor structure of FIG. 6 after forming a second epitaxial semiconductor region extending from second ends of the buried nanowire segments while covering the first epitaxial semiconductor region.

Referring to FIG. 7, a second epitaxial semiconductor region 72 is formed adjoined to a second side of the gate structure (42, 44, 50) opposite the first side by a second selective epitaxial growth process. The second epitaxial semiconductor region 72 merges adjacent buried nanowire segments 30S on the second ends opposite the first ends. The second epitaxial semiconductor region 72 may have faceted surfaces.

The second epitaxial semiconductor region 72 can be formed by epitaxially depositing a second semiconductor material over the second end surfaces of the buried nanowire segments 30S while covering the first epitaxial semiconductor region 62 and the gate structure (42, 44, 50) by a patterned second mask layer 70. The second epitaxial semiconductor region 72 includes a semiconductor material that is different from the semiconductor material providing the first epitaxial semiconductor region 62. The semiconductor material providing the second epitaxial semiconductor region 72 is typically the same as the semiconductor material providing the buried nanowire segments 30S. The second epitaxial semiconductor region 72 may be doped with dopants having a conductivity type opposite to the conductivity type of the first epitaxial semiconductor region 62. For example, if the first epitaxial semiconductor region 62 has a p-type conductivity, the second epitaxial semiconductor region 72 can have an n-type conductivity, and vice versa. In one embodiment and when the first epitaxial semiconductor region 62 is composed of p-type germanium and the buried nanowire segments 30S are composed of intrinsic silicon, the second epitaxial semiconductor region 72 can include n-doped silicon. A homojunction thus is present at the interfaces between each of the buried nanowire segments 30S and the second epitaxial semiconductor region 72.

After the formation of the epitaxial source regions, the patterned second mask layer 70 can be removed, for example, by oxygen-based plasma etching.

The first epitaxial semiconductor region 62 can function as a source region and the second epitaxial semiconductor region 72 can function as a drain region for a nanowire FET. A nanowire TFET with asymmetrical source and drain regions are thus obtained because the first epitaxial semiconductor region 62 and the second epitaxial semiconductor region 72 are composed of different semiconductor materials and are of different conductivity types. Due to the direct bandgap and higher tunneling efficiency, III-V semiconductor materials are preferred material of choice as the source and drain regions for nanowire TFETs.

Figure 8:
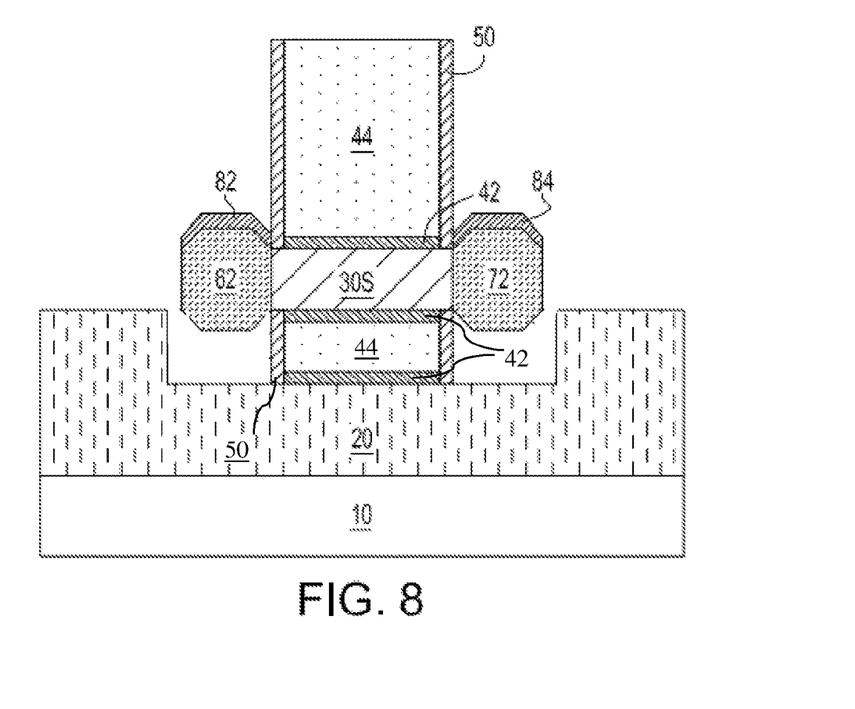
FIG. 8 is a cross-sectional view of the exemplary semiconductor structure of FIG. 7 after forming a first metal semiconductor alloy region atop the first epitaxial semiconductor region and a second metal semiconductor alloy region atop the second epitaxial semiconductor region.

Referring to FIG. 8, a first metal semiconductor alloy region 82 is formed atop the first epitaxial semiconductor region 62, and a second metal semiconductor alloy region 84 is formed atop the second epitaxial semiconductor region 72. Each of the first and second semiconductor alloy regions 82, 84 can include a metal silicide or a metal germicide. The first and the second metal semiconductor alloy regions 82, 84 can be formed by first depositing a metal such as for example, Ni, Pt, Co, and alloys such as NiPt, on the surfaces of the first and the second epitaxial semiconductor regions 62, 72. An anneal is then performed that causes reaction between the metal and the first and the second epitaxial semiconductor regions 62, 72. After annealing, any unreactive metal can be removed. In one embodiment and when the gate electrode 44 is composed of doped polysilicon, a third metal semiconductor alloy region (not shown) can also be formed on top of the gate stack (42, 44).

Figure 9:
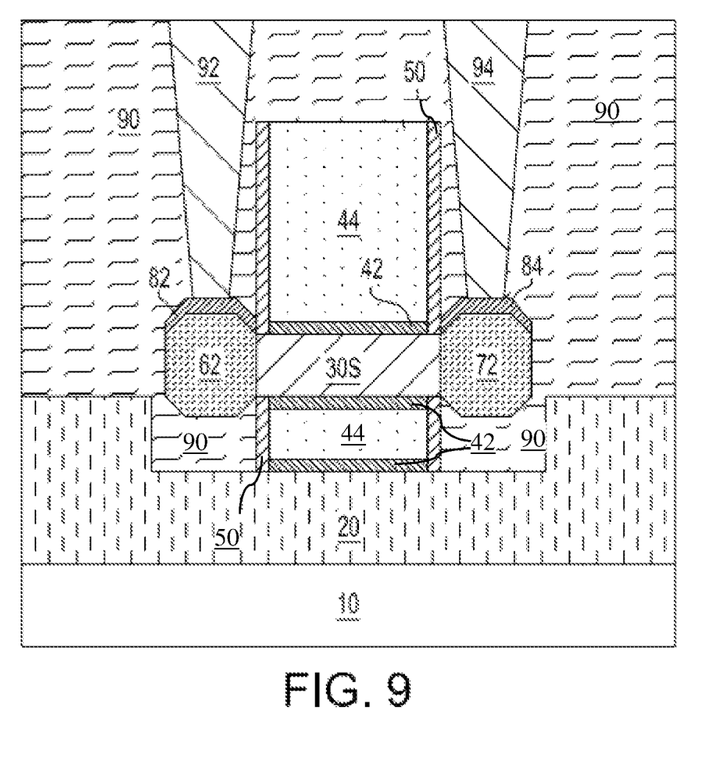
FIG. 9 is a cross-sectional view of the exemplary semiconductor structure of FIG. 8 after forming a first contact structure contacting the first metal semiconductor alloy region and a second contact structure contacting the second metal semiconductor alloy region.

Referring to FIG. 9, a contact level dielectric layer 90 is formed over the buried insulator layer, the gate structure (42, 44, 50) and the first metal semiconductor alloy regions 82, 84. The contact level dielectric layer 90 may comprise a dielectric material including, for example, oxides, nitrides or oxynitrides. In one embodiment, the contact level dielectric layer 90 includes silicon dioxide. The contact level dielectric layer 90 may be formed, for example, by CVD or spin-coating. The contact level dielectric layer 90 may be self-planarizing, or the top surface of the contact level dielectric layer 90 can be planarized, for example, by chemical mechanical planarization (CMP). In one embodiment, the planarized top surface of the contact level dielectric layer 90 is located above the top surface of the gate electrode 44.

Contact structures are formed in the contact level dielectric layer 90 to provide electrical contacts to the metal semiconductor alloy regions 82, 84. The contact structures includes a first contact structure 92 contacting a top surface of the first metal semiconductor alloy region 82 and a second contact structure contacting a top surface of the second metal semiconductor alloy region 84. The first and the second contact structures can be formed by formation of contact openings (not shown) in the contact level dielectric layer 90 by a by a combination of lithographic patterning and anisotropic etch followed by deposition of a conductive material (e.g., tungsten) and planarization that removes an excess portions of the conductive material from above the top surface of the contact level dielectric layer 90. Optionally, contact liners (not shown) may be formed on the sidewalls and bottoms surfaces of the contact openings before filling the interconnect contact openings with the conductive material. The contact liners may include TiN.

While the methods and structures disclosed herein have been particularly shown and described with respect to preferred embodiments thereof, it will be understood by those skilled in the art that the foregoing and other changes in forms and details may be made without departing from the spirit and scope of the present application. It is therefore intended that the methods and structures disclosed herein not be limited to the exact forms and details described and illustrated, but fall within the scope of the appended claims.

What is claimed is:
1. A method of forming a semiconductor structure comprising:
 forming at least one nanowire segment wrapped around by a gate structure located on a substrate, the at least one nanowire segment having a first end and a second end opposite the first end;
 forming a first epitaxial semiconductor region extending from the first end of the at least one nanowire segment, the first epitaxial semiconductor region comprising a first semiconductor material and dopants of a first conductivity type; and
 forming a second epitaxial semiconductor region extending from the second end of the at least one nanowire segment, the second epitaxial semiconductor region comprising a second semiconductor material different from the first semiconductor material and dopants of a second conductivity type opposite the first conductivity type.

2. The method of claim 1, wherein the at least one nanowire segment comprises the second semiconductor material and is intrinsic.

3. The method of claim 1, wherein at least one nanowire segment comprises intrinsic silicon, the first epitaxial semiconductor region comprises p-doped germanium, and the second epitaxial semiconductor region composes n-doped silicon.

4. The method of claim 1, wherein the forming the at least one nanowire segment comprises:
forming at least one nanowire suspended by a first pad portion and a second pad portion over the substrate;
forming the gate structure around a portion of the at least one nanowire; and
removing portions of the at least one nanowire that is not covered by the gate structure, wherein the portion of the at least one nanowire that remains covered by the gate structure provides the nanowire segment.

5. The method of claim 4, wherein the substrate includes a handle substrate and a buried insulator layer present over the handle substrate, wherein the at least one nanowire is suspended above a recessed region of the buried insulator layer.

6. The method of claim 5, wherein the forming the at least one nanowire comprising:
providing a semiconductor insulator substrate (SOI) comprising, from bottom to top, the handle substrate, the buried insulator layer and a top semiconductor layer;
patterning the top semiconductor layer to provide a top semiconductor portion comprising the first pad portion, the second pad portion and at least one nanowire portion connecting the first pad portion and the second pad portion; and
converting the at least one nanowire portion to the at least one nanowire by annealing.

7. The method of claim 5, wherein the recess portion of the buried insulator layer is formed by isotropic etch.

8. The method of claim 5, wherein the gate structure comprises a first portion located above a top surface of the at least one nanowire segment and a second portion located within a space between the at least one nanowire segment and the recessed region of the buried insulator layer.

9. The method of claim 5, wherein forming the gate structure comprises:
forming a gate dielectric layer over exposed surfaces of the at least one nanowire, the first pad portion, the second pad portion and the recessed region of the buried insulator layer;
forming a gate electrode layer over the gate dielectric layer, the gate electrode layer filling the space between the at least one nanowire and the recessed region of the buried insulator layer;
patterning the gate dielectric layer and the gate electrode layer to provide a gate stack wrapping around the portion of the at least one nanowire; and
forming a gate spacer on sidewalls of the gate stack.

10. The method of claim 1, wherein the first end of the at least one nanowire segment is vertically aligned with a first sidewall of the gate structure, and a second end of the at least one nanowire segment is vertically aligned with a second sidewall of the gate structure opposite the first sidewall.

11. The method of claim 1, wherein the forming the first epitaxial semiconductor region comprises:
forming a patterned first mask layer covering the second end of the at least one nanowire segment and the gate structure, while exposing the first end of the at least one nanowire segment;
epitaxially growing a doped first semiconductor material from the exposed first end of the at least one nanowire segment to provide the first epitaxial semiconductor region; and
removing the patterned first mask layer.

12. The method of claim 10, wherein the forming the second epitaxial semiconductor region comprises:
forming a patterned second mask layer covering the first epitaxial semiconductor region, while exposing the second end of the at least one nanowire segment;
epitaxially growing a doped second semiconductor material from the exposed second end of the at least one nanowire segment to provide the second epitaxial semiconductor region; and
removing the patterned second mask layer.

13. The method of claim 1, further comprising forming a first metal semiconductor alloy region atop the first epitaxial semiconductor region, and a second metal semiconductor alloy region atop the second epitaxial semiconductor region.

14. The method of claim 13, wherein the forming the first metal semiconductor alloy region and the second metal semiconductor alloy region comprises:
forming a metal layer on the exposed surfaces of the first epitaxial semiconductor region and the second epitaxial semiconductor region;
forming the first metal semiconductor alloy region and the second metal semiconductor alloy region by annealing; and
removing an unreacted portion of the metal layer.

15. The method of claim 14, wherein each of the first metal semiconductor alloy region and the second metal semiconductor alloy region comprises a silicide or a germicide.

16. The method of claim 13, further comprising forming a contact level dielectric layer over the substrate, the gate structure, the first epitaxial semiconductor region and the second epitaxial semiconductor region.

17. The method of claim 16, further comprising planarizing the contact level dielectric layer, wherein a planarized top surface of the contact level dielectric layer is located above a topmost surface of the gate structure.

18. The method of claim 16, further comprising forming a first contact structure contacting a top surface of the first metal semiconductor alloy region, and a second contact structure contacting a top surface of the second metal semiconductor alloy region.

19. The method of claim 18, wherein the forming the first contact structure and the second contact structure comprises:
forming a first contacting opening extending through the contact level dielectric layer to expose the top surface of the first metal semiconductor alloy region and a second contacting opening extending through the contact level dielectric layer to expose the top surface of the second metal semiconductor alloy region; and
filling the first contact opening and the second contact opening with a conductive material.

20. The method of claim 19, further comprising forming a contact liner on sidewalls and a bottom surface of each of the first contact opening and the second contact opening prior to the filling the first contact opening and the second contact opening with the conductive material.

* * * * *